(12) United States Patent
Zakel et al.

(10) Patent No.: US 7,932,611 B2
(45) Date of Patent: Apr. 26, 2011

(54) DEVICE FOR ALTERNATELY CONTACTING TWO WAFERS

(75) Inventors: Elke Zakel, Falkensee (DE); Ghassem Azdasht, Berlin (DE)

(73) Assignee: Pac Tech—Packaging Technologies GmbH, Nauen (DE)

( * ) Notice: Subject to any disclaimer, the term of this patent is extended or adjusted under 35 U.S.C. 154(b) by 120 days.

(21) Appl. No.: 10/581,819

(22) PCT Filed: Dec. 2, 2004

(86) PCT No.: PCT/DE2004/002648
§ 371 (c)(1),
(2), (4) Date: May 14, 2007

(87) PCT Pub. No.: WO2005/055288
PCT Pub. Date: Jun. 16, 2005

(65) Prior Publication Data
US 2007/0272991 A1 Nov. 29, 2007

(30) Foreign Application Priority Data

Dec. 3, 2003 (DE) .................. 103 57 027
Dec. 23, 2003 (DE) .................. 103 61 521

(51) Int. Cl.
*H01L 23/48* (2006.01)
(52) U.S. Cl. .. 257/777; 257/414; 257/734; 257/E25.013
(58) Field of Classification Search .................. 438/455, 438/106, 109; 257/414, 82, 99, 432, 727, 257/734, 777, E25.013
See application file for complete search history.

(56) References Cited

U.S. PATENT DOCUMENTS

| | | | | |
|---|---|---|---|---|
| 4,612,083 A | * | 9/1986 | Yasumoto et al. | 438/59 |
| 5,250,469 A | * | 10/1993 | Tanaka et al. | 29/840 |
| 5,481,082 A | | 1/1996 | Yamamoto | |
| 5,500,540 A | * | 3/1996 | Jewell et al. | 257/82 |
| 5,617,441 A | * | 4/1997 | Nakata et al. | 372/70 |

(Continued)

FOREIGN PATENT DOCUMENTS

DE 29 02 002 7/1980

(Continued)

OTHER PUBLICATIONS

EPP Elektronik Production und Pruftechnik, ISSN 0943-0962, Nov. 2000, pp. 50 and 52.

(Continued)

*Primary Examiner* — Thanh V Pham
*Assistant Examiner* — Duy T Nguyen
(74) *Attorney, Agent, or Firm* — Blakely, Sokoloff, Taylor & Zafman LLP.

(57) ABSTRACT

A method and device for alternately contacting two wafer-like component composite arrangements, in which the two component composite arrangements, provided with contact metallizations on their opposing contact surfaces, are brought into a coverage position with their contact metallizations to form contact pairs, in which position the contact metallizations to be joined together are pressed against one another, the contact metallizations being contacted by exposing the rear of one of the component composite arrangements to laser radiation, the wavelength of the laser radiation being selected as a function of the degree of absorption of the component composite arrangement , so that a transmission of the laser radiation through the component composite arrangement exposed to the laser radiation at the rear is essentially suppressed or an absorption of the laser radiation takes place essentially in the contact metallizations of one or both component composite arrangements.

6 Claims, 4 Drawing Sheets

U.S. PATENT DOCUMENTS

| | | | |
|---|---|---|---|
| 5,858,607 A * | 1/1999 | Burberry et al. | 430/201 |
| 6,043,985 A * | 3/2000 | Azdasht et al. | 361/707 |
| 6,062,461 A | 5/2000 | Sparks et al. | |
| 6,762,072 B2 * | 7/2004 | Lutz | 438/53 |
| 6,887,770 B2 * | 5/2005 | Ueda et al. | 438/455 |
| 7,186,637 B2 * | 3/2007 | Kloster et al. | 438/614 |
| 2002/0076902 A1 * | 6/2002 | Geusic | 438/455 |
| 2002/0113218 A1 * | 8/2002 | Okumura et al. | 250/548 |
| 2002/0115234 A1 | 8/2002 | Siniaguine | |
| 2002/0115265 A1 * | 8/2002 | Iwafuchi et al. | 438/458 |
| 2003/0025188 A1 * | 2/2003 | Farnworth et al. | 257/686 |
| 2003/0146384 A1 * | 8/2003 | Logsdon et al. | 250/338.1 |
| 2003/0207073 A1 * | 11/2003 | Takezawa et al. | 428/106 |
| 2003/0214029 A1 * | 11/2003 | Tao et al. | 257/723 |
| 2004/0180464 A1 * | 9/2004 | Horning et al. | 438/51 |

FOREIGN PATENT DOCUMENTS

| | | |
|---|---|---|
| DE | 42 34 342 A 1 | 4/1994 |
| DE | 43 21 804 A 1 | 1/1995 |
| DE | 197 51 487 A 1 | 6/1999 |
| EP | 1 199 744 A1 | 4/2002 |
| EP | 1 346 949 A2 | 9/2003 |
| EP | 1 357 590 A2 | 10/2003 |
| EP | 1 369 912 A2 | 12/2003 |
| WO | WO 01/39986 A1 | 6/2001 |

OTHER PUBLICATIONS

Mescheder, U.M., et al. "Local laser bonding for low temperature budget," Sensors and Actuators A, Elsevier Sequoia, S.A., Apr. 2002, pp. 422-427, vol. 97-98, Lausanne, Switzerland.

Tao, Yi, et al. "Investigation of Laser-assisted Bonding for MEMS Packaging," International Journal of Nonlinear Science and Numerical Simulation, Aug. 2002, pp. 422-427, vol. 3, No. 3/4, Freund Publishing House, Tel-Aviv, Israel.

PCT International Search Report and Written Opinion for PCT/DE2004/002648, mailed Nov. 29, 2005.

PCT International Preliminary Report on Patentability for PCT Counterpart Application No. PCT/DE2004/002648, 11 pgs. (Jun. 7, 2006).

* cited by examiner

DEVICE FOR ALTERNATELY CONTACTING TWO WAFERS

CROSS-REFERENCE TO OTHER APPLICATIONS

This is a National Phase of International Application No. PCT/DE2004/002648, filed on Dec. 2, 2004, which claims priority from German Patent Application No. 103 57 027.6, filed on Dec. 3, 2003 and German Patent Application No. 103 61 521.0, filed on Dec. 23, 2003.

BACKGROUND OF THE INVENTION

The present invention relates to a method for alternately contacting two wafer-like component composite arrangements consisting of a plurality of cohesively designed similar components that are referred to below simply as wafers, in particular a semiconductor wafer having a function component wafer for production of electronic modules on a wafer level as well as a device for performing said method. In addition, the invention also relates to a component composite consisting of two wafer-like component composite arrangements alternately contacted to one another according to the aforementioned method.

The method of the aforementioned type is used in general when the object is to join substrates designed cohesively in a composite with components also arranged in a composite without first releasing the respective composite.

To manufacture electronic modules on a chip level, it is known for chips and/or chip modules, with function components such as a laser diode being controlled via the chips, to manufacture both the chip and the laser diode on a wafer level, i.e., in a cohesive wafer composite, and then to separate both the chip and the laser diode from the respective wafer composite before bringing the chip into contact with the laser diode. This results in the necessity for performing a positioning and joining operation, which is required for contacting the chip with the laser diode, and this must be done separately and repeatedly depending on the number of chips and/or laser diodes.

Depending on the type and design of the function component provided for contacting with the chip, it has also proven necessary to ensure a contacting procedure in which the thermal load of the function component remains within predetermined limits and to monitor this procedure accordingly. These limits are very low, in particular in the case of function components that are very susceptible to temperature, such as plastic film microlenses, so that with each individual contacting operation between the chip and the function component, it is important to ensure that the temperature reached in the contacting operation in the function component during the contacting procedure is limited, e.g., through appropriate cooling measures.

SUMMARY OF THE INVENTION

The present invention is based on the object of permitting production of corresponding electronic modules on a wafer level and also ensuring that an admissible temperature burden is not exceeded even in the case of temperature-sensitive function components.

To achieve this object, (1) the inventive method has the features of a method for alternate contacting two wafer-like component composite arrangements consisting of a plurality of cohesively designed similar components, in particular of a semiconductor wafer with a function component wafer for manufacturing electronic modules on a wafer level, in which the two component composite arrangements, each provided with contact metallizations on their opposing contact surfaces, are brought into a coverage position with their contact metallizations to form contact pairs, in which position the contact metallizations that are to be joined together are pressed against one another, the contact metallizations being thereby contacted by exposing the rear of one of the component composite arrangements to laser radiation, whereby the wavelength of the laser radiation is selected as a function of the degree of absorption of the component composite arrangement exposed to laser radiation at the rear, so that transmission of the laser radiation through the component composite arrangement exposed to the laser radiation at the rear is essentially suppressed absorption of the laser radiation takes place essentially in the contact metallizations of one or both component composite arrangements; (2) the inventive device has the features of a device for alternately contacting two wafer-like component composite arrangements consisting of a plurality of cohesively designed identical components, in particular of a semiconductor wafer having a function component wafer for manufacturing electronic modules, having a receiving frame for supporting and holding the first component composite arrangement on a transparent panel arranged in the receiving frame, having a diode laser composite arrangement arranged inside the receiving frame and separated from the component composite arrangement by the transparent panel, having a holding clamp for receiving the second component composite arrangement such that contact surfaces of the component composite arrangements provided with contact metallizations are arranged opposite one another, having a positioning device for relative positioning of the component composite arrangements such that the contact metallizations to be joined together form contact pairs, and having a pressure device for generating a contact pressure between the contact metallizations of the contact pairs; and (3) the inventive component composite has the features of a component composite comprised of two wafer-like component composite arrangements to be contacted alternately with a first transparent component composite arrangement comprised of a plurality of cohesively designed transparent cover elements and a second component composite arrangement comprised of a plurality of cohesively designed sensor units each having at least one sensor each of which is brought into contact with a substrate unit of a sensor unit which is equipped with through-contacts for rear contact access to the sensor unit.

In the inventive method, the two wafers, each provided with contact metallizations on their opposing contact surfaces, are brought into a coverage position with their contact metallizations to form contact pairs; in this position, the contact metallizations to be joined together are pressed against one another. Contact is established between the contact metallizations by exposing the rear of one wafer to laser radiation, the wavelength of the laser radiation being selected as a function of the degree of absorption of the wafer exposed to laser radiation at the rear in such a way that transmission of the laser radiation through the wafer exposed to laser radiation at the rear is essentially suppressed.

This ensures that heating of the second wafer, which is to be brought into contact with the first wafer, essentially takes place via the contact metallizations forming the contact pairs and direct exposure of the second wafer to the laser radiation is prevented.

The wafer composite created by bringing the two wafers into contact may subsequently be separated by single feed into separate electronic modules, each consisting of a chip and a function component contacted thereto.

If the component composite arrangement exposed to laser radiation at the rear is selected so that the laser radiation is transmitted through the component composite arrangement exposed to laser radiation at the rear and absorption of the laser radiation takes place essentially in the contact metallizations of the component composite arrangement exposed to laser radiation at the rear, then it is possible for the heating of the contact metallizations that is required for contacting, which may take place in the method essentially by thermocompression or by curing of an adhesive or by other possible joining methods requiring heat input for activation, to be performed through essentially direct heating of the contact metallizations. Especially when the contact metallizations of the component composite arrangement exposed to laser radiation at the rear are made of a material having a higher thermal capacity in comparison with the substrate material of the component composite arrangement opposite it, then it may be ensured that the increase in temperature required for contacting essentially occurs only in the area of the contact metallizations.

Simultaneous input of heat into the contact metallizations of the component composite arrangement exposed to laser radiation at the rear and into the contact metallizations of the component composite arrangement situated opposite the former may take place when the component composite arrangement exposed to laser radiation at the rear is selected so that there is transmission of the laser radiation through the component composite arrangement exposed to laser radiation at the rear and there is absorption of the laser radiation in the contact metallizations of the component composite arrangement exposed to laser radiation at the rear and in the contact metallizations of the opposing component composite arrangement which have a larger area in comparison with the contact metallizations of the component composite arrangement exposed to laser radiation at the rear.

In an especially preferred variant of this method, the laser exposure is accomplished by means of a composite arrangement of multiple diode lasers that are activated to emit laser radiation either individually or in groups, such that all the contact pairs or the contact pairs that are combined into groups are exposed to laser radiation for contacting.

First, the use of laser diodes for applying laser radiation to the wafer permits an especially accurate adjustability of the wavelength emitted by the laser-active layer of the diode laser so that an accordingly high degree of absorption can be achieved in the wafer that is exposed at the rear. Secondly, the defined activation of selected diode lasers from a composite arrangement permits a laser treatment precisely to the extent needed for contacting. Similarly, the wafer exposed at the rear is heated only to the extent absolutely necessary for contacting. This reduces the possible transfer of thermal radiation from the first wafer heated by absorption to the opposing second wafer that is provided for contacting.

If the diode laser composite arrangement is designed as a diode laser linear arrangement which is situated at a distance below the wafer treated with laser radiation at the rear, such that the diode laser linear arrangement is moved in at least one axis and parallel to the plane of extent of the wafer, then the inventive method can be implemented by using a relatively small number of diode lasers.

As an alternative, it is possible to design the diode laser composite arrangement as a diode laser matrix arrangement, in which case the diode lasers are activated in their entirety or only to the extent of a partial matrix, depending on the size of the wafer exposed to laser radiation at the rear. This variant of the process permits simultaneous contacting of all contact pairs so that contacting can be performed on a wafer level within an extremely short period of time and with a minimal temperature burden for the additional wafer.

If a reference temperature is measured in an interspace formed by the distance between the wafer exposed at the rear and the diode laser composite arrangement and the measurement is performed by means of a transmission device through which the laser radiation passes, then it is possible to continuously monitor the temperature in the wafer exposed at the rear during the laser treatment to at least briefly deactivate the diode laser composite arrangement on reaching a temperature threshold, for is example.

Preventing an unnecessary temperature burden on the wafer to be brought into contact with the wafer exposed at the rear is also supported by the use of a positioning device for aligning the contact metallizations in a coverage position and designing the contact pairs, said positioning device acting biaxially and in parallel to the plane of extent of the wafer, because with accurate relative positioning of the contact pairs, the lowest possible heat input into the opposing wafer is needed to produce the contact.

The inventive device is equipped with a receiving frame for holding and supporting a first wafer on a transparent panel situated in the receiving frame and a diode laser composite arrangement situated so that it is separated from the wafer by the transparent panel within the receiving frame. In addition, the inventive device has a holding clamp to hold a second wafer in such a way that the contact faces of the wafers, each provided with contact metallizations, are arranged opposite one another, and the inventive device also has a positioning device for relative positioning of the wafers in such a way that contact metallizations to be joined together form contact pairs. In addition, the inventive device is equipped with a pressure device for generating a contact pressure between the contact metallizations of the contact pairs.

In a first embodiment of the device, the diode laser composite arrangement is designed as a diode laser linear arrangement having a plurality of diode lasers arranged in a row, each arranged on a diode laser mount that is movable across the alignment of the row and parallel to the plane of extent of the wafer.

In addition, it has proven advantageous if the diode lasers of the diode laser linear arrangement can be activated individually or in groups in such a way that only the diode lasers of the diode laser linear arrangement which are needed to cover the respective transverse extent of the wafer contact surface as a function of the distance to be traversed can be activated for exposure of a circular wafer contact surface to the diode laser linear arrangement that can be moved parallel to the plane of extent of the laser.

In an alternative embodiment of the device, the diode laser composite arrangement is designed as a diode laser matrix arrangement having a plurality of diode lasers arranged in rows and columns.

With the inventive diode laser matrix arrangement, it has proven advantageous if the diode lasers can be activated individually or in groups such that, depending on the size of the wafer contact surface area, with a coaxial alignment of the midpoints of the areas of the wafer contact surface and the matrix surface, the diode lasers can be activated as a whole or only to the extent of a partial matrix required to cover the wafer contact surface area.

For monitoring the contacting method, it has proven advantageous if a transmission device that is used for measurement of a reference temperature is situated in an interspace formed between the transparent panel and the diode laser composite arrangement.

In addition, to minimize the heat input required for contacting, it has proven advantageous if the wafer opposite the wafer that is exposed to the laser radiation at the rear is arranged in a positioning device that can be moved at least biaxially to align the contact metallizations in a coverage position to form the contact pairs.

If the positioning device is designed with three axes such that the positioning device is capable of executing an adjusting movement across the plane of extent in addition to the biaxial positioning of the wafer in the plane of extent of the wafer, then the positioning device may also be used to create the contact pressure required to establish the contact.

A composite part of two wafer-like component composite arrangements alternately brought into contact with one another, this composite being produced by the method described above using the device described above according to this invention, has a first transparent component composite arrangement comprising a plurality of cohesively designed transparent cover units and a second component composite arrangement comprising a plurality of cohesively designed sensor units, each having at least one sensor, contacted on one of the substrate units designed cohesively in the composite, these substrate units being provided with through-contacts for rear contact access to the sensor unit. The design of the component composite described above allows production of a sensor chip that is closed on the whole without any unacceptably high temperature burden on the sensor during the manufacturing process.

In a preferred embodiment of the component composite, the opposing contact metallizations of the cover units and sensor units that are to be brought into contact have a solder material. This makes it possible to perform the contacting in a thermocompression process.

In an alternative design of a component composite, of the group of contact metallizations assigned to the cover units and the group of contact metallizations assigned to the sensor units, at least one group is provided with a conducting adhesive as the contact material. In the case of this component composite, it is possible to perform the contacting by hardening the adhesive material through heating.

Regardless of the choice of the contact material provided for contacting, it has proven advantageous if at least one group of contact metallizations has an absorption layer as the substrate for the contact material, i.e., the solder material or adhesive material, this absorption layer being made of a highly absorbent material such as chromium. In the area of the contact metallizations, this achieves the result that increased heating occurs in the area of the contact metallizations, regardless of the transmittance of the substrate materials used for the cover units and/or the sensor units.

To improve adhesion between the absorption layer and the contact material applied to it, an adhesion promoting layer comprising an adhesive material that is tailored to the particular combination of contact material and material used for the absorption layer may be selected.

If the absorption layer of the group of contact metallizations assigned to the sensor units has a surface area that is larger in comparison with the absorption layer of the group of contact metallizations assigned to the cover units, specific input of heat may be achieved not only into the contact metallizations of the cover units but also into the contact metallizations of the sensor units.

For a hermetically sealed design of the sensor chip unit created in a cohesive composite, it has proven advantageous if a contact metallization of the cover units which surrounds the sensor in a ring is brought into contact with a respective contact metallization of the substrate units which surrounds the sensor in a ring in order to form a sealing ring.

BRIEF DESCRIPTION OF THE DRAWINGS

Variants of the inventive method and alternatives for equipment used in the method are explained below on the basis of the drawing as examples. They show.

DETAILED DESCRIPTION OF THE INVENTION

Figure 1:
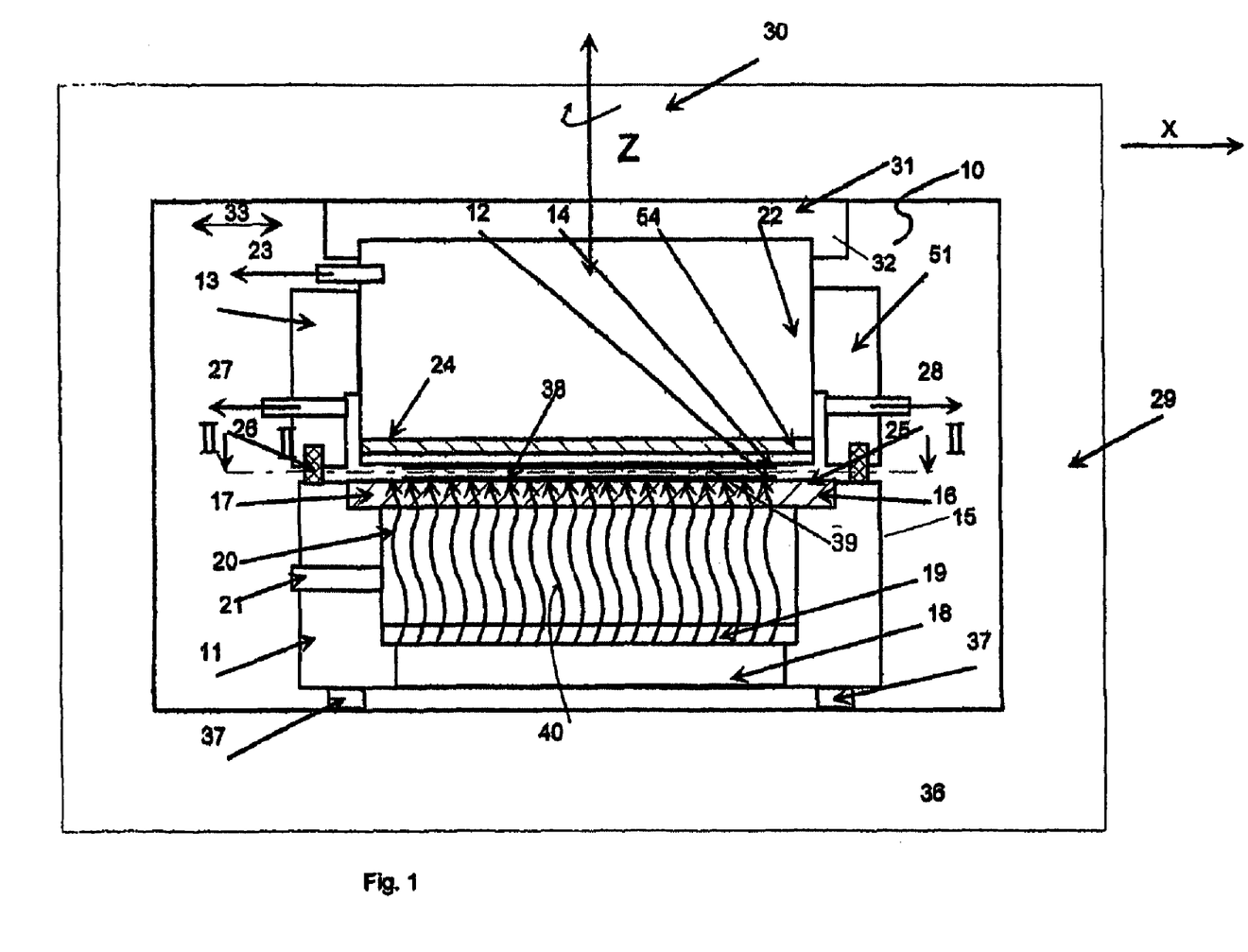
FIG. 1 a device for alternately contacting two wafers, shown in a side view, with a diode laser composite arrangement situated beneath a transparent panel for supporting and holding the wafers.

FIG. 1 shows a wafer contacting device 10 having a receiving frame 11 for holding and supporting a first wafer, designed here as a semiconductor wafer 12, and having a holding clamp 13 with a second wafer held by it, designed in the present case as a function component wafer 14 with a plurality of plastic lens parts arranged therein in the composite.

The receiving frame 11 consists of a frame cylinder 15, having a ring-shaped shoulder 16 which serves to hold a transparent panel, designed here as a glass plate 17 on its upper end. On its end face opposite the glass plate 17, the receiving frame 11 is provided with a diode laser composite arrangement 18. Above the diode laser composite arrangement 18, there is a transmission device 19 which allows laser radiation 20 emitted by the diode laser composite arrangement 18 to pass through essentially without absorption and which has at least one temperature sensor device (not shown here) for measuring a reference temperature. In addition, a pressure connection 21 is provided in the frame cylinder 15 on its circumference, making it possible to apply compressed air to a frame interior space 40 formed between the glass plate 17 and the diode laser composite arrangement 18 and/or the transmission device 19.

The holding clamp 13, which also has a frame cylinder 51 in the present exemplary embodiment, has a pressure-resistant housing 22 which is provided with a vacuum connection 23 and is accommodated by the frame cylinder 51. A wall of the housing 22 which serves as the mating holding surface 24 is designed as a porous sheet. The function component wafer 14 is held against the mating holding surface 24 by applying a vacuum at the vacuum connection 23 in the manner illustrated in FIG. 1. In the present exemplary embodiment, the porous panel is provided with an elastic porous intermediate layer 54 to be able to equalize the contact pressure acting between the contact metallization during contacting.

As FIG. 1 shows, a process space 25 formed between the receiving frame 11 and the holding clamp 13 is sealed at its circumference with respect to the environment by an elastic seal 26. The process space 25 is connected to the environment via gas connections 27, 28. The gas connections 27, 28 allow a vacuum to be applied or allow a protective gas to be injected into the process space 25, for example. Vacuum degassing may prove to be advantageous when using adhesive material as the joining material, for example.

The receiving frame 11 is held together with the holding clamp 13 in a machine frame 29 that is closed on the periphery. To generate the contact pressure required for contacting contact metallization (not shown here) of the semiconductor wafer 12 with contact metallization of the function component wafer 14, said contact pressure prevailing between the contact pairs formed by contact metallization arranged opposite one another, a positioning device 31 is provided between the housing 22 and an upper frame beam 30 of the machine frame 29, having a housing part 32 connected to the housing 22 and a housing part 33 connected to the upper frame beam 30. In addition to the biaxial relative positioning of the housing part 32 with respect to the housing part 33 about a Z-axis perpendicular to the planar extent of the wafers 12, 14 and an X-axis 35 parallel to the planar extent of the wafers 12, 14, the positioning device 31 permits a relative movement of the housing part 32 in relation to the housing part 33 in the direction of the Z-axis and thus an adjusting movement of the function component wafer 14 in the direction of the semiconductor wafer 12 to produce the contact pressure or surface pressure required for contacting.

To control the height of the contact pressure, force measurement cells 37 are arranged over the end face circumference of the receiving frame 11, distributed between the receiving frame 11 and a lower frame beam 36 of the machine frame 29.

To establish the contact between the wafers 12 and 14, the semiconductor wafer 12 is applied to the glass plate 17 of the receiving frame 11. The contact of the function component wafer 14 with the mating holding surface 24 of the housing 22 by the holding clamp 13 is accomplished by applying a vacuum to the interior of the housing and the associated suction of the function component wafer 14 against the mating holding surface 24 designed as a porous sheet. Accurate relative positioning of the contact metallization on a contact surface 38 of the function component wafer 14 in relation to contact metallization on a contact surface 39 of the semiconductor wafer 12 is then accomplished by designing contact pairs of the respectively paired contact metallization. The alignment required for this is accomplished by means of the positioning device 31 and corresponding activation of axial controls about the Z-axis and in the direction of the X-axis.

The positioning operation can be monitored, for example, by means of an optical monitoring system (not shown here) capable of detecting a coverage of at least two contact pairs at a distance from one another between contact metallization of the semiconductor wafer 12 and contact metallization of the function component wafer 14.

After adjusting the exact relative position, the holding clamp 13 is adjusted in the direction of the receiving frame 11 by means of an axial control of the positioning device 31 in the direction of the Z-axis until the force measurement cells 37 can detect that the threshold for the correct contact pressure has been reached and the corresponding axial drive is deactivated. To equalize any sagging of the glass plate 17 due to the contact pressure, the interior space 40 of the receiving frame 11 can be put under a fluid pressure, i.e., a gas pressure or a liquid pressure, through the pressure connection 41. Thus, when it is certain that all contact pairs are in opposition to one another with the contact pressure required for contacting, then the diode laser composite arrangement 18 is activated; this may take place in various ways, depending on the design of the diode laser composite arrangement 18.

Figure 2:
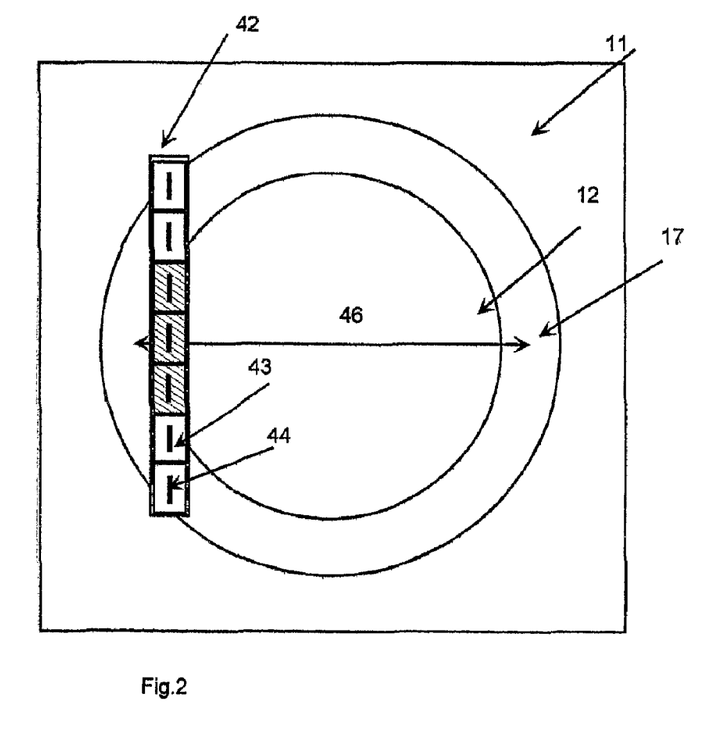
FIG. 2 a first embodiment of the device shown in FIG. 1 with a diode laser linear arrangement as seen from above and in an initial position of a distance to be traversed.
Figure 3:
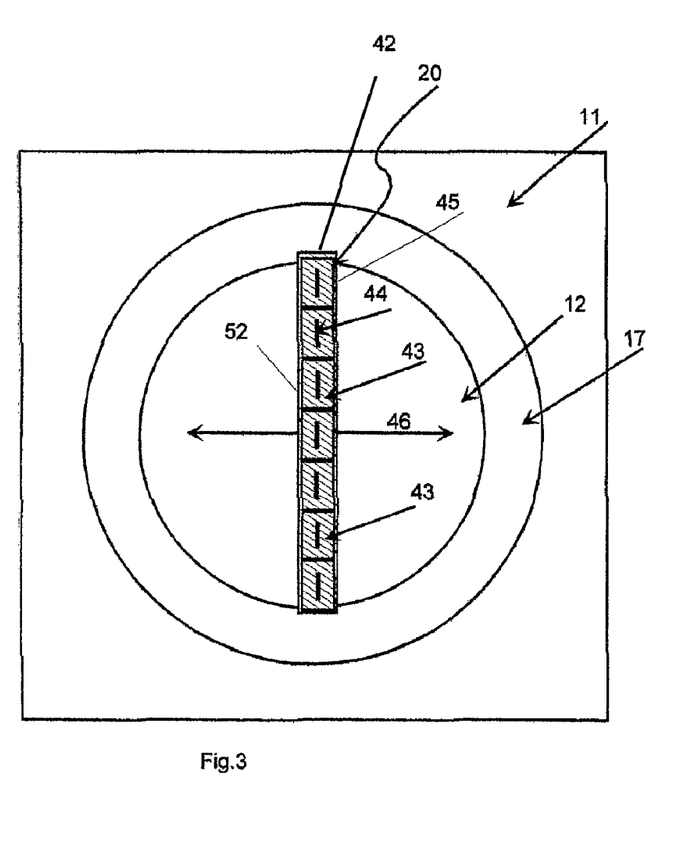
FIG. 3 the diode laser linear arrangement illustrated in FIG. 2 in a middle position of the distance to be traversed in relation to the wafer being exposed.

FIGS. 2 and 3 show top views of the receiving frame 11 according to the sectional line II-II in FIG. 1. This shows the semiconductor wafer 12 (only in its outline contours) which is arranged on the glass plate 17 of the receiving frame 11 and is exposed at the rear to the laser radiation 20 by means of a diode laser linear arrangement 42. In the present case, the diode laser linear arrangement 42 includes seven laser diodes 43 arranged on a diode laser mount 52, each emitting a beam path 44 according to their typical stratified design with one laser-active layer, said beam path having an approximately rectangular cross section and becoming wider, up to a beam cross-sectional area 45 which is usually several square centimeters in size, so that the beam strikes the rear of the semiconductor wafer 12 and a large number of terminal faces are exposed to laser radiation at the same time, depending on the terminal surface density of the semiconductor wafer 12.

The diode laser linear arrangement 42 is equipped with control means, which is not explained further here but which makes it possible to activate the diode lasers 43 of the diode laser linear arrangement 42 either individually or in groups. To expose the entire rear contact surface of the semiconductor wafer 12 to laser radiation, the diode laser linear arrangement 42 is moved from the initial position shown in FIG. 2 over the entire diameter of the semiconductor wafer 12. In this process, only those diode lasers 43 are activated as a function of the distance 46 to be traversed, and in such a number as to be able to cover the respective diameter of the semiconductor wafer 12 across the distance 46 to be traversed. Thus, in the exemplary embodiment illustrated here, FIG. 2 shows the diode laser linear arrangement 42 in the starting position with only three activated diode lasers 43, and FIG. 3, which illustrates a middle position of the diode laser linear arrangement 42 along the distance 46 to be traversed, shows activation of all diode lasers 43 of the diode laser linear arrangement 42.

Figure 4:
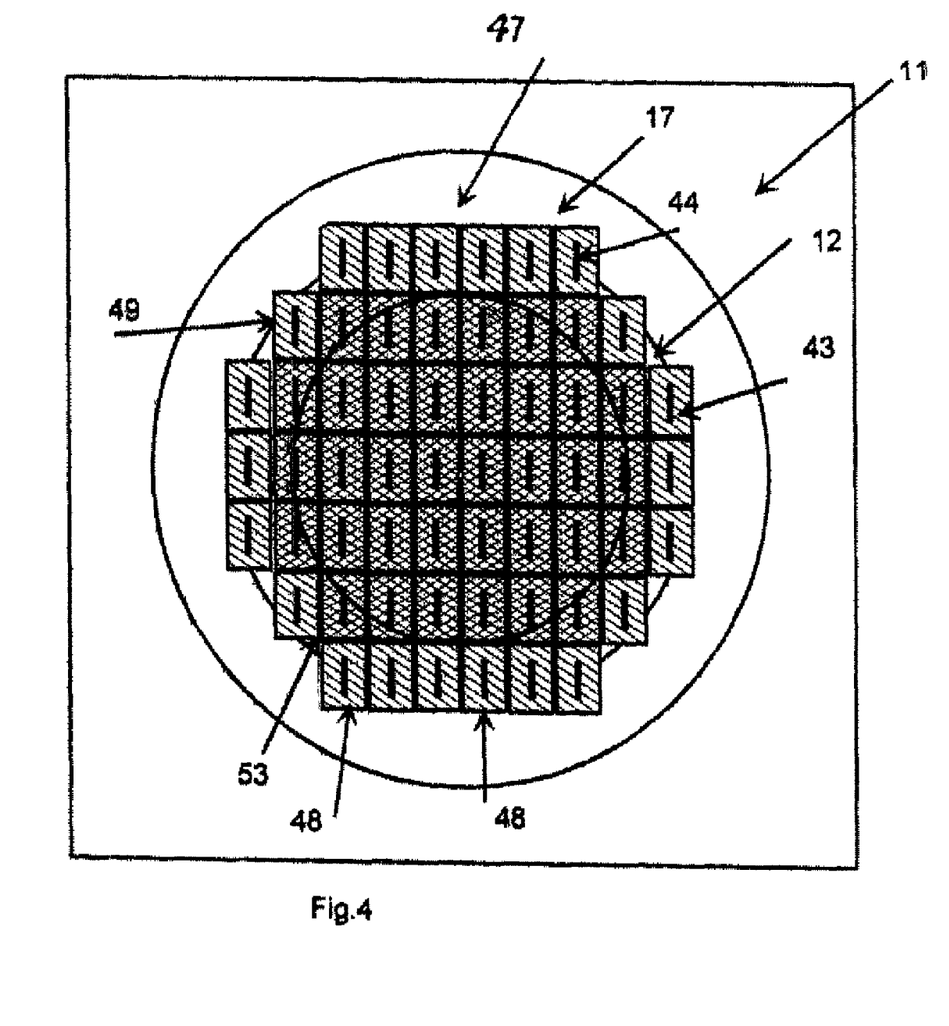
FIG. 4 an embodiment of the diode laser composite arrangement as a diode laser matrix arrangement as seen from above.

FIG. 4 shows a diode laser matrix arrangement 47 having ten diode laser columns 48 and seven diode laser rows 49. The matrix of the diode laser matrix arrangement 47 is designed to be irregular to adjust to the fundamentally circular design of the semiconductor wafer 12 and because of the rectangular design of the beam cross section 45, so that the entire contact surface 39 of the semiconductor wafer 12 can be exposed to the laser radiation.

As illustrated by the cross-hatched diagram in FIG. 4, showing part of the beam cross-sectional areas 45 of the diode lasers 43, for laser treatment of a semiconductor wafer 14 having a reduced diameter in comparison with the semiconductor wafer 12, only a part of the diode laser 43 according to a partial matrix 53 needs be activated.

Figure 5:
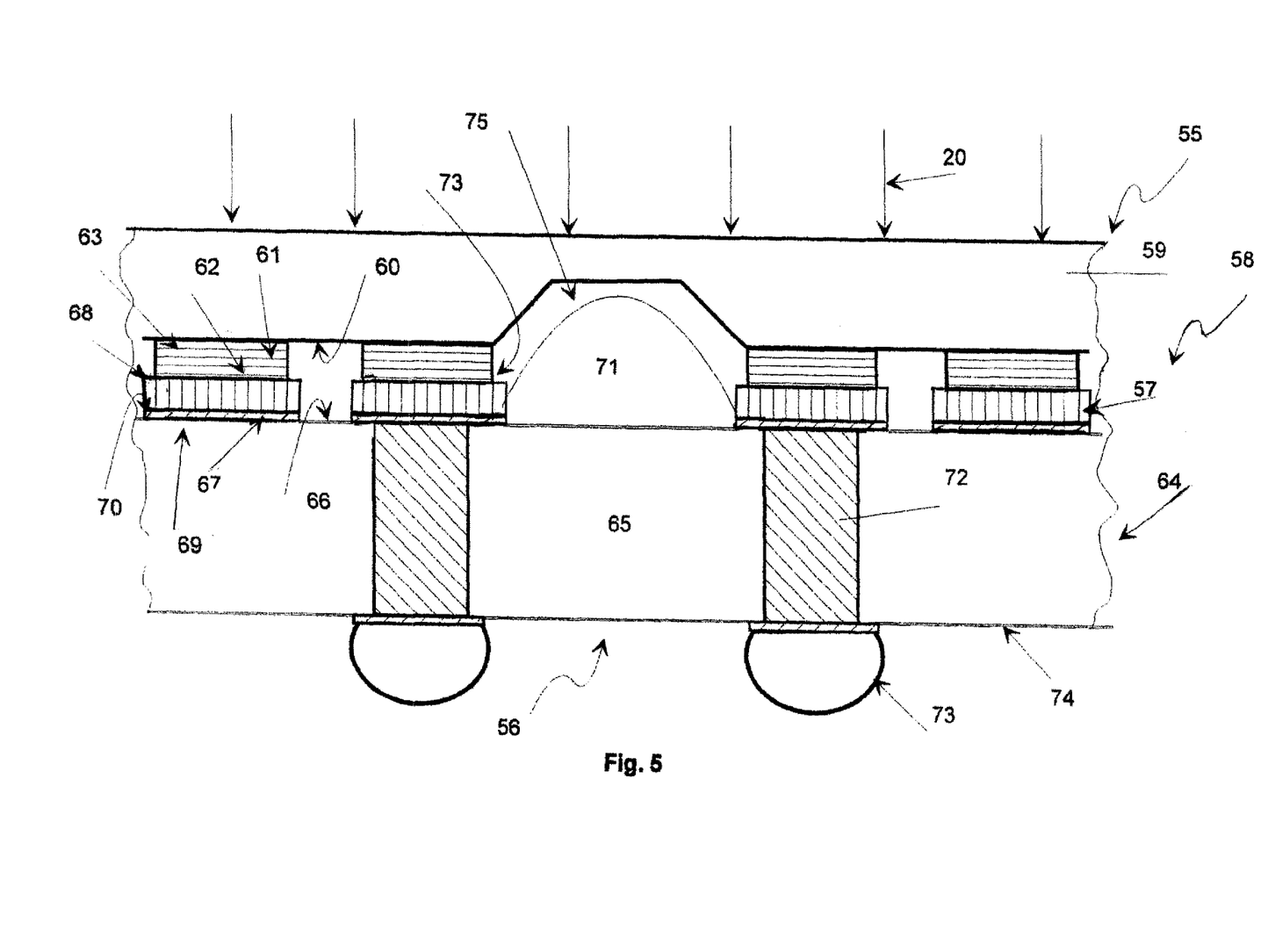
FIG. 5 an alternative variant of the method on the example of a structure produced by means of the process variant.

FIG. 5 shows in a detail the area of a sensor chip unit 57 of a sensor chip component composite arrangement 58, the sensor chip unit 57 being manufactured in a composite consisting of a cover unit composite arrangement 55 and a sensor unit composite arrangement 56.

The sensor chip component composite arrangement 58 can be manufactured by means of wafer contacting device 10 illustrated in FIG. 1.

For production, cover units 59, which are designed cohesively in the wafer-type cover unit composite arrangement 55, are exposed to laser radiation at the rear. In the present case, the cover units 59 have a transparent substrate material such as glass frit, which is optically transparent, and on their contact surface 60 they have contact metallization 61 which, in the present case, are provided with a solder material as the contact material 62, e.g., a gold-tin alloy. To increase the heat absorption by the contact metallization 61, the contact metallization 61 have an absorption layer 63, which is designed as a substrate and faces the laser radiation 20 and may contain essentially chromium, for example.

The sensor unit composite arrangement 56 is composed of a plurality of sensor units 64, each being assigned to a cover unit 59 and formed in the cohesive composite. In the present case, the sensor units 64 have a silicon substrate 65 equipped with contact metallization 67 on its internal contact surface 65 facing the cover unit 59. In the present case, the contact metallization 67 along with the respective contact metallization 61 of the cover unit 59 are all equipped with a solder material as the contact material 68. In addition, the contact metallization 67 in the present case have absorption layers 69 which are arranged as a substrate to the contact material 68 and protrude peripherally beyond the contact material 68 in such a way that a portion of the laser radiation 20 passing through the optically transparent substrate material of the cover unit 59 is absorbed in a peripheral projecting part 70 of the absorption layers 69. Thus, simultaneous heat input through absorption into the contact metallization 61 of the cover layer 59 and also into the contact metallization 67 of the sensor units 64 is made possible due to the arrangement and embodiment of the absorption layers 63 and 69 as described above.

As can also be seen in FIG. 5, the internal contact metallization 67 arranged adjacent to a sensor 71 of the sensor unit 64 are provided with through-contacts 72 through the substrate 65, permitting outside contacting via external contact metallization 73 on an external contact surface 74 of the sensor units 64. The contact metallization 67 adjacent to the sensor 71 are brought into electrical contact with the sensor 71 in a manner not shown here so that an outside direct contacting of the sensor 71 is made possible via the outer contact metallization 73 by means of the through-contacts 72.

The contact metallization 61 and 67 on the outside in FIG. 5 are each designed in the form of a ring, forming, after contacting, a closed sensor receptacle space 75 in which internal contact metallization pairs 76 are arranged so they are hermetically sealed for electric contacting of the sensor 71 and the sensor 71 is hermetically sealed.

In contrast with the exemplary embodiment described above, the substrate material of the cover units 59 may also be designed to be absorbent, since the temperature-sensitive sensor 71 is arranged on the sensor units 64 that are not directly exposed to the laser radiation 20.

What is claimed:

1. A device for alternately contacting two wafer-like component composite arrangements comprising:
   a receiving frame for supporting and holding a first component composite arrangement on a transparent panel arranged in the receiving frame;
   a diode laser composite arrangement arranged inside the receiving frame and separated from the first component composite arrangement by the transparent panel;
   a holding clamp for receiving a second component composite arrangement such that contact surfaces of the first and the second component composite arrangements provided with contact metallizations are arranged opposite one another;
   a positioning device for relative positioning of the component composite arrangements such that the contact metallizations to be joined together form contact pairs; and
   a pressure device for generating a contact pressure between the contact metallizations of the contact pairs;
   wherein the diode laser composite arrangement is designed as a diode laser linear arrangement having a plurality of diode lasers arranged in a row, wherein the plurality of diode lasers arranged on a diode laser mount are configured to move across the alignment of the row and in parallel to a plane of extent of the component composite arrangement; and
   wherein the diode lasers of the diode laser linear arrangement are configured to be activated individually or in groups, wherein which of the diode lasers of the diode laser linear arrangement are needed to be activated for coverage of the respective transverse extent of a circular contact surface of the component composite arrangement is selected based on a distance to be traversed by the plurality of diode lasers in relation to the first component composite arrangement for acting upon the circular contact surface of the first component composite arrangement, wherein the diode laser linear arrangement is configured to move in parallel to the plane of extent of the component composite arrangement.

2. The device according to claim 1, wherein the diode laser composite arrangement is designed as a diode laser matrix arrangement having a plurality of diode lasers each arranged in rows and columns.

3. The device according to claim 2, wherein the diode lasers of the diode laser matrix arrangement are configured to be activated individually or in groups such that with a coaxial alignment of the surface midpoints of the contact surface of the component composite arrangement and of the matrix surface for acting upon the circular contact surface, the diode lasers are configured to be activated according to the size of the contact surface either in a totality or only to the extent of a partial matrix required for coverage of the contact surface.

4. The device according to claim 1, wherein a transmission device which serves to measure a reference temperature is provided in an intermediate space formed by a distance between the transparent panel and the diode laser composite arrangement.

5. The device according to claim 1, wherein for alignment of the contact metallizations in a coverage position to form the contact pairs, the second component composite arrangement opposite the first component composite arrangement that is exposed to laser radiation at the rear is arranged in the positioning device that is configured to be moved in at least two axes.

6. The device according to claim 5, wherein the positioning device is designed to be triaxial such that in addition to a biaxial positioning of the component composite arrangement in the plane of extent of the component composite arrangement, the positioning device serves to execute an adjusting movement across the plane of extent such that the positioning device serves to create the contact pressure.

* * * * *